US009706676B2

(12) United States Patent
Moon et al.

(10) Patent No.: US 9,706,676 B2
(45) Date of Patent: Jul. 11, 2017

(54) SYSTEM FOR INSTALLING REMOVABLE EXTERNAL COMPONENT IN ELECTRONIC DEVICES

(71) Applicant: Samsung Electronics Co., Ltd., Gyeonggi-do (KR)

(72) Inventors: Hee-Cheul Moon, Gyeonggi-do (KR); Kwon-Ho Son, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/881,323

(22) Filed: Oct. 13, 2015

(65) Prior Publication Data

US 2016/0113142 A1 Apr. 21, 2016

(30) Foreign Application Priority Data

Oct. 17, 2014 (KR) .................. 10-2014-0140568

(51) Int. Cl.
| | |
|---|---|
| *H01R 13/629* | (2006.01) |
| *H05K 7/14* | (2006.01) |
| *H04B 1/3816* | (2015.01) |
| *H04B 1/3818* | (2015.01) |
| *F16B 1/00* | (2006.01) |
| *H01Q 1/12* | (2006.01) |
| *H05K 5/03* | (2006.01) |

(52) U.S. Cl.
CPC ............ *H05K 7/1418* (2013.01); *F16B 1/00* (2013.01); *H01Q 1/12* (2013.01); *H04B 1/3816* (2013.01); *H04B 1/3818* (2015.01); *H05K 5/03* (2013.01); *H05K 7/1402* (2013.01); *F16B 2001/0035* (2013.01)

(58) Field of Classification Search
CPC ............ H01R 13/6205; H05K 7/1418; H05K 7/1421; H05K 7/1402; H04B 1/3816; H04B 1/3818
USPC ....... 439/152, 629, 630, 305, 308, 296, 298, 439/38, 39, 40.13
See application file for complete search history.

(56) References Cited

U.S. PATENT DOCUMENTS

| | | | | |
|---|---|---|---|---|
| 6,101,372 | A * | 8/2000 | Kubo ................... | H04B 1/3816 439/354 |
| 6,602,096 | B1 * | 8/2003 | Kronestedt .......... | G06K 7/0021 439/188 |
| 7,125,258 | B2 * | 10/2006 | Nakakubo ........ | G06K 19/07741 439/328 |
| 8,462,514 | B2 * | 6/2013 | Myers .................... | G06K 13/08 361/754 |
| 9,281,610 | B2 * | 3/2016 | Ejiri .................... | H01R 13/5213 |
| 2003/0195020 | A1 * | 10/2003 | Kubo ................... | H04B 1/3816 455/575.1 |
| 2007/0072443 | A1 * | 3/2007 | Rohrbach .......... | H01R 13/6205 439/39 |

(Continued)

OTHER PUBLICATIONS

European Search Report dated Mar. 2, 2016.

*Primary Examiner* — Harshad Patel
(74) *Attorney, Agent, or Firm* — Cha & Reiter, LLC

(57) ABSTRACT

An electronic device comprising: an housing; a tray detachably disposed in a slot formed in the housing, wherein the tray includes: a mounting portion adapted to receive a removable external component, a tray cover having a surface facing an exterior of the housing, and a connector formed between the mounting portion and the tray cover.

19 Claims, 26 Drawing Sheets

(56) References Cited

U.S. PATENT DOCUMENTS

| | | | |
|---|---|---|---|
| 2008/0096606 A1* | 4/2008 | Park | G06K 7/0021 |
| | | | 455/558 |
| 2008/0165508 A1* | 7/2008 | Wang | H04M 1/026 |
| | | | 361/728 |
| 2011/0255252 A1 | 10/2011 | Sloey et al. | |
| 2012/0307451 A1* | 12/2012 | Shukla | G06F 1/1658 |
| | | | 361/699 |
| 2013/0171748 A1* | 7/2013 | Maruyama | H01L 22/32 |
| | | | 438/14 |
| 2013/0267106 A1* | 10/2013 | Jenks | G11B 17/00 |
| | | | 439/160 |
| 2013/0334948 A1* | 12/2013 | Chung | H05K 7/1461 |
| | | | 312/333 |
| 2014/0075074 A1* | 3/2014 | Lee | H04B 1/3818 |
| | | | 710/302 |
| 2014/0170864 A1* | 6/2014 | Hwang | H01R 13/6205 |
| | | | 439/38 |
| 2014/0179136 A1* | 6/2014 | Wang | H01R 12/7094 |
| | | | 439/155 |
| 2014/0218877 A1* | 8/2014 | Wei | H04B 1/3816 |
| | | | 361/752 |

* cited by examiner

SYSTEM FOR INSTALLING REMOVABLE EXTERNAL COMPONENT IN ELECTRONIC DEVICES

CLAIM OF PRIORITY

This application claims the benefit under 35 U.S.C. §119(a) of a Korean patent application filed in the Korean Intellectual Property Office on Oct. 17, 2014 and assigned Serial No. 10-2014-0140568, the entire disclosure of which is hereby incorporated by reference.

BACKGROUND

1. Field of the Disclosure

The present disclosure relates to electronic devices, and more particularly to a system for installing removable integrated circuit modules in electronic devices.

2. Description of the Related Art

While functions of portable electronic devices have recently been diversified, a device which is advantageous in portability can have a much higher compatibility. For example, even if electronic devices have the same function, an electronic device which is slimmer, lighter, thinner, and simpler can be preferred. Therefore, manufacturers of the electronic devices compete with each other to develop a device slimmer, lighter, thinner, and simpler than other products while having the same or more advanced functions.

As one way of such a trend, the electronic device has external components selectively or necessarily applied therein. Such external components have been gradually becoming smaller, and an interface device capable of recognizing the external components applied to the electronic device also has been becoming smaller.

For example, such external components may be represented as a card-type external component such as a memory card capable of extending a storage space of the electronic device, a Subscriber Identification Module (SIM) installed at one electronic device in a detachable manner so as to be used by a plurality of users authenticated in different ways, and the like. Accordingly, manufacturers of a terminal are making an effort to effectively apply such external components to the electronic device.

SUMMARY

According to aspects of the disclosure, an electronic device comprising: a housing; a tray detachably disposed in a slot formed in the housing, wherein the tray includes: a mounting portion adapted to receive a removable external component, a tray cover having a surface facing an exterior of the housing, and a connector formed between the mounting portion and the tray cover.

According to aspects of the disclosure, a tray extraction element is provided for extracting a tray from an electronic device, the tray extraction element comprising: a body; and a tray contact portion that is at least partially formed of a metal material or a magnetic material, wherein the tray contact portion is adapted to extract the tray from the electronic device by magnetically coupling with the tray when the tray contact is brought into magnetic contact with a cover of the tray.

According to aspects of the disclosure, a tray is provided comprising: a mounting portion adapted to receive a removable integrated circuit module; a tray cover; and a connector formed between the mounting portion and the tray cover According to aspects of the disclosure, a kit is provided comprising: a tray extraction element; an electronic device including a housing having a slot; and a tray disposed in the slot, wherein the tray includes a mounting portion adapted to receive a removable integrated circuit module, a tray cover having a surface facing an exterior of the housing, and a connector formed between the mounting portion and the tray cover, and wherein the tray includes a body and a tray contact portion that is at least partially formed of a metal material or a magnetic material, the tray contact portion being adapted to extract the tray from the electronic device by magnetically coupling with the tray when the tray contact portion is brought into magnetic contact with a cover of the tray.

BRIEF DESCRIPTION OF THE DRAWINGS

The above and other aspects, features and advantages of certain embodiments of the present disclosure will be more apparent from the following detailed description taken in conjunction with the accompanying drawings, in which.

DETAILED DESCRIPTION

Figure 1:
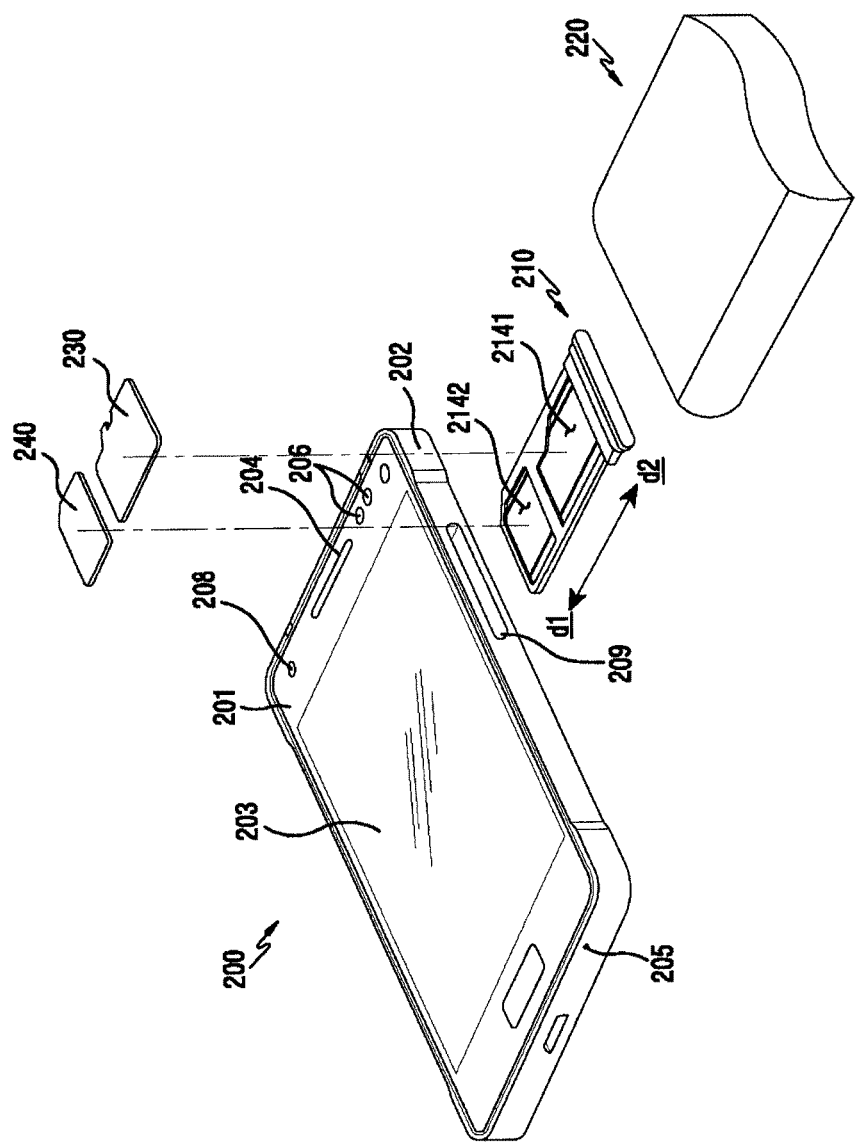
FIG. 1 is a perspective view of an electronic device, according to various embodiments of the present disclosure.

Hereinafter, various embodiments of the present disclosure are described with reference to the accompanying drawings. While the various embodiments of the present disclosure are susceptible to various modifications and alternative forms, a specific embodiment thereof has been shown by way of example in the drawings and will herein be described in detail. It should be understood, however, that it is not intended to limit the various embodiments of the present disclosure to the particular form disclosed, but, on the contrary, the various embodiments of the present disclosure are to cover all modifications, equivalent, and alternatives falling within the spirit and scope of the various embodiments of the present disclosure as defined by the appended claims. Like reference numerals denote like constitutional elements throughout the drawings.

The expression "include" or "may include" used in the various embodiments of the present disclosure is intended to indicate a presence of a corresponding function, operation, or constitutional element disclosed herein, and it is not intended to limit a presence of one or more functions, operations, or constitutional elements. In addition, in the various embodiments of the present disclosure, the term "include" or "have" is intended to indicate that characteristics, numbers, steps, operations, constitutional elements, and elements disclosed in the specification or combinations thereof exist. As such, the term "include" or "have" should be understood that there are additional possibilities of one or more other characteristics, numbers, steps, operations, constitutional elements, elements or combinations thereof.

In various embodiments of the present disclosure, an expression "or" includes any and all combinations of words enumerated together. For example, "A or B" may include A or B, or may include both of A and B.

Although expressions used in various embodiments of the present disclosure such as "first", "second", "first", "second" may be used to express various constitutional elements of the various embodiments, it is not intended to limit the corresponding constitutional elements. For example, the above expressions are not intended to limit an order or an importance of the corresponding constitutional elements. The above expressions may be used to distinguish one constitutional element from another constitutional element. For example, a first user device and the second user device are both user devices, and indicate different user devices. For example, a first constitutional element may be termed a second constitutional element, and similarly, the second constitutional element may be termed the first constitutional element without departing from the scope of the various embodiments of the present disclosure.

When a constitutional element is mentioned as being "connected" to or "accessing" another constitutional element, this may mean that it is directly connected to or accessing the other constitutional element, but it is to be understood that there are no intervening constitutional elements present. On the other hand, when a constitutional element is mentioned as being "directly connected" to or "directly accessing" another constitutional element, it is to be understood that there are no intervening constitutional elements present.

The terminology used in various embodiments of the present disclosure is for the purpose of describing particular embodiments only and is not intended to be limiting of the various embodiments of the present disclosure. A singular expression includes a plural expression unless there is a contextually distinctive difference therebetween.

Unless otherwise defined, all terms (including technical and scientific terms) used herein have the same meaning as commonly understood by those ordinarily skilled in the art to which various embodiments of the present disclosure belong. It will be further understood that terms, such as those defined in commonly used dictionaries, should be interpreted as having a meaning that is consistent with their meaning in the context of the relevant art and the various embodiments of the present disclosure, and will not be interpreted in an idealized or overly formal sense unless expressly so defined herein.

An electronic device according to various embodiments of the present disclosure may be a device including a communication function. For example, the electronic device may include at least one of a smart phone, a tablet Personal Computer (PC), a mobile phone, a video phone, an e-book reader, a desktop PC, a laptop PC, a netbook computer, a Personal Digital Assistant (PDA), a Portable Multimedia Player (PMP), a MPEG-1 Audio Layer 3 (MP3) player, a mobile medical device, a camera, and a wearable device (e.g., a Head-Mounted-Device (HMD) such as electronic glasses, electronic clothes, an electronic bracelet, an electronic necklace, an electronic appcessory, an electronic tattoo, or a smart watch).

According to certain embodiments, the electronic device may be a smart home appliance having a communication function. For example, the smart home appliance may include at least one of a TeleVision (TV), a Digital Video Disk (DVD) player, an audio, a refrigerator, an air conditioner, a cleaner, an oven, a microwave oven, a washing machine, an air purifier, a set-top box, a TV box (e.g., Samsung HomeSync™, Apple TV™, or Google TV™), a game console, an electronic dictionary, an electronic key, a camcorder, and an electronic picture frame.

According to certain embodiments, the electronic device may include at least one of various medical devices (e.g., Magnetic Resonance Angiography (MRA), Magnetic Resonance Imaging (MRI), Computed Tomography (CT), imaging equipment, ultrasonic instrument, etc.), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, and Point Of Sales (POS) of shops.

According to certain embodiments, the electronic device may include at least one of a furniture or a part of building/constructions including a communication function, an electronic board, an electronic signature input device, a projector, and various measurement machines (e.g., water supply, electricity, gas, propagation measurement machine, etc.). The electronic device according to various embodiments of the present disclosure may be one or more combinations of the aforementioned various devices. In addition, the electronic device according to various embodiments of the present disclosure may be a flexible device. In addition, it is apparent those ordinarily skilled in the art that the electronic device according to the various embodiments of the present disclosure is not limited to the aforementioned devices.

Hereinafter, an electronic device according to various embodiments will be described with reference to the accompanying drawings. The term 'user' used in the various embodiments may refer to a person who uses the electronic device or a device which uses the electronic device (e.g., an Artificial Intelligence (AI) electronic device).

Various embodiments of the present disclosure describe one tray disposed on a side surface of an electronic device, and explain various embodiments thereof. However, the present disclosure is not limited thereto, and the tray can be installed in any area as long as the tray operates without any problem. Thus, two or more trays can be simultaneously disposed at different locations.

FIG. 1 is a perspective view of an electronic device 200 to which a tray 210 is applied to accommodate external components 230 and 240 according to various embodiments of the present disclosure.

Referring to FIG. 1, a display 203 may be disposed on a front surface 201 of the electronic device 200. A speaker 204 for receiving a voice of a peer user may be installed on an upper side of the display 203. A microphone 205 for transmitting a voice of a user of the electronic device to the peer user may be installed on a lower side of the display 203.

According to an embodiment, components for performing various functions of the electronic device 200 may be placed near an area in which the speaker 204 is installed. The components may include at least one sensor module 206. The sensor module 206 may include, for example, an illumination sensor (e.g., an optical sensor), a proximity sensor (e.g., an optical sensor), an infrared sensor, and an ultrasonic sensor. In some embodiments, the component may include a Light Emitting Diode (LED) indicator 208 to allow the user to recognize state information of the electronic device 200.

According to various embodiments, a tray mounting hole 209 may be disposed on a side surface 202 of the electronic device 200. According to an embodiment, the tray 210 may be placed in a direction d1 toward the tray mounting hole or may be installed in an opposite direction d2 in a detachable manner. According to an embodiment, the tray mounting hole 209 may be installed at a position corresponding to a slot disposed inside the electronic device 200, and by performing only an operation of inserting the tray 210, on which the external components 230 and 240 are placed, to the tray mounting hole 209, the external components 230 and 240 may be physically and/or electrically connected to a plurality of corresponding connectors provided in the slot. Any of the external components 230 and 240 may include any suitable type of removable integrated circuit module, such as a SIM card, an SD card, etc.

According to various embodiments, the tray 210 may include one or more external component mounting portions 2141 and 2142. According to an embodiment, at least one of the external components 230 and 240 may be placed to the external component mounting portions 2141 and 2142. According to an embodiment, as illustrated, one pair of the external component mounting portions 2141 and 2142 may be disposed on the tray 210, and the first external component 230 and the second external component 240 may be respectively disposed on the external component mounting portions 2141 and 2142. According to an embodiment, the external components 230 and 240 may be card-type external components. According to an embodiment, if the electronic device 200 is a mobile communication terminal, the external components 230 and 240 may be Subscriber Identification Module (SIM) cards. According to an embodiment, the external components 230 and 240 may be add-on memory modules. Although in this example the external components 230 and 240 are card-type removable integrated circuit modules, in some implementations they may have a different shape and/or configuration.

According to various embodiments, when completely inserted into the electronic device 200, the tray 210 may be aligned with the side surface 202 of the electronic device 200. According to an embodiment, when the tray 210 is intended to be separated from the electronic device 200, an additional tray extraction element 220 may be used. According to an embodiment, the tray extraction element 220 may include at least one magnet. The tray 210 may be formed of a material that is attracted to the magnet (e.g., a metal and/or a magnetic material)

In some implementations, the tray extraction element 220 may be arranged to extract the tray 210 from the electronic device 200. For, example the tray extraction element may be provided with a magnet that is capable of generating a magnetic force that is greater than the friction (and other) forces that might hold the tray 210 in place in the electronic device. Additionally or alternatively, the tray extraction element 220 may be provided with a plurality of magnets that are arranged in such a sequence and/or location(s), so as to facilitate the extraction of the tray 210 (e.g., see FIG. 12).

In operation, when it comes in magnetic contact with the tray 210 while the tray 210 is inserted into the electronic device 210, the magnet of the tray extraction element 220 may exert a magnetic force on the tray 210 that is sufficient to extract the tray 210 from the electronic device.

Figure 2:
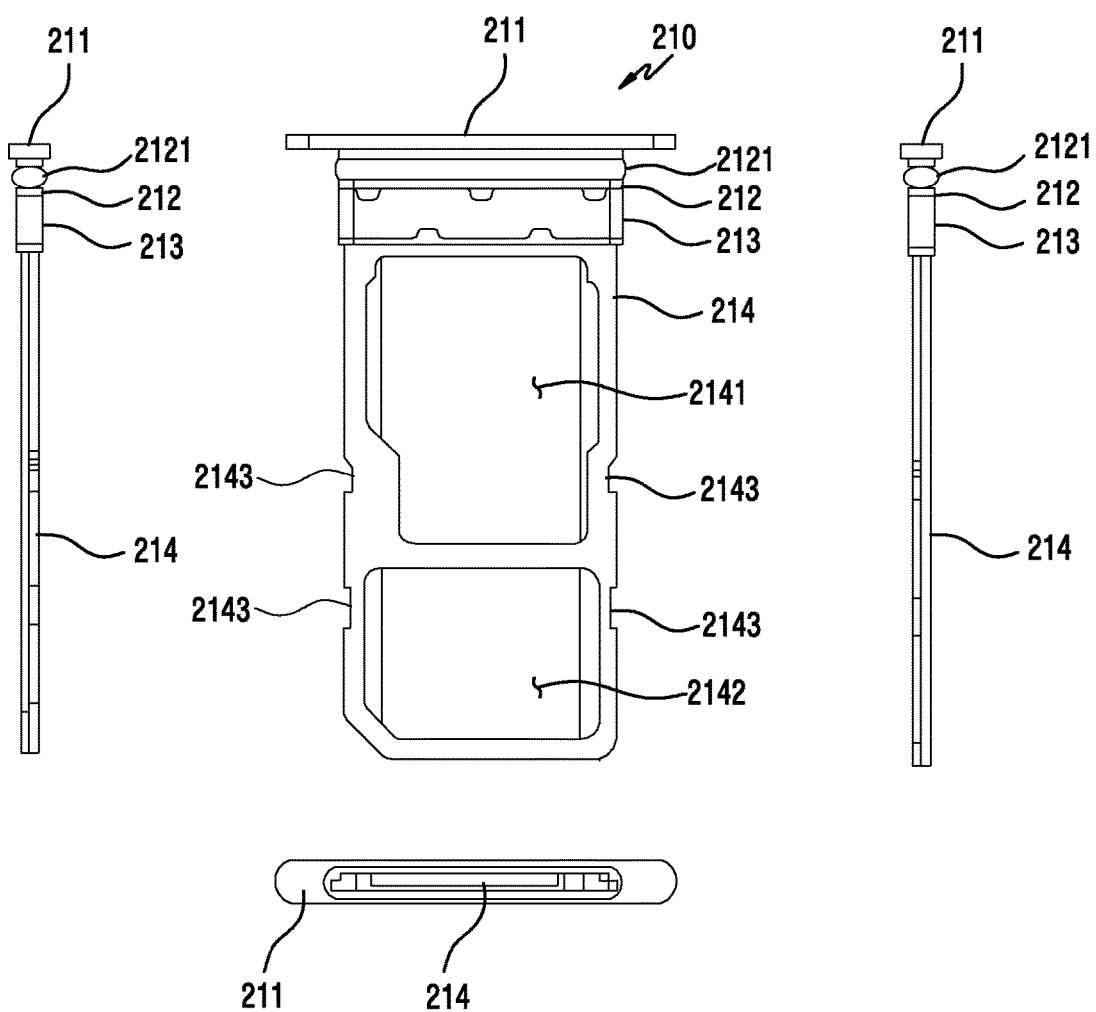
FIG. 2 is a diagram of an example of a tray, according to various embodiments of the present disclosure.
Figure 3:
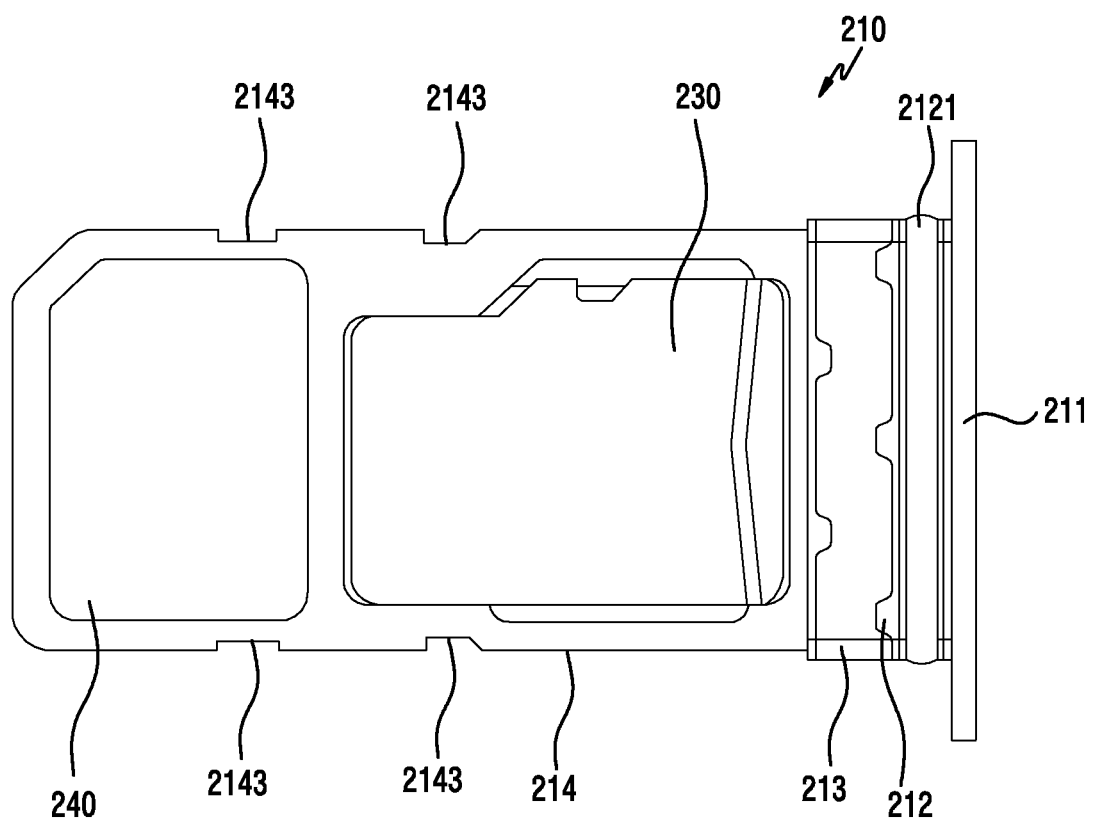
FIG. 3 is a diagram of an example of a tray with external components placed therein, according to various embodiments of the present disclosure.

FIG. 2 is a diagram of an example of the tray 210, according to various embodiments of the present disclosure. FIG. 3 is a diagram of an example of the tray 210 in which external components 230 and 240 (e.g., removable integrated circuit modules) are placed in the tray 210 according to exemplary embodiments of the present disclosure.

Referring to FIG. 2, the tray 210 may include a tray cover 211, a first body 212 formed in combination with the tray cover 211, a second body 214 including at least one of the external component mounting portions 2141 and 2142 for accommodating at least one of the external components 230 and 240, and a connector 213 for connecting the first body 212 and the second body 214.

According to various embodiments, the tray cover 211 may be disposed aligned with a surface of the electronic device 200 as a part of being exposed outside the electronic device 200 when the tray 210 is placed to the electronic device 200. According to an embodiment, the tray cover 211 may be formed of metal. According to an embodiment, the tray cover 211 may be formed of a magnetic material and/or a material which is attracted to magnets.

According to various embodiments, the first body 212 formed in combination with the tray cover 211 may be formed to have a cross-sectional area smaller than that of the tray cover 211. According to an embodiment, the tray cover 211 and the first body 212 may be utilized as antenna radiators.

According to various embodiments, the second body 214 may include the external component mounting portions 2141 and 2142 formed in parallel. According to an embodiment, the second body 214 may also be formed of a metal material. According to an embodiment, the metallic first and second bodies 212 and 214 may be connected by means of the connector 213. In some embodiments, when the first body 212 and/or the tray cover 211 are utilized as antenna radiators, the connector 213 may be formed of a non-metal material to avoid interference with the metallic second body 214. In some embodiments, the connector 213 may also be formed of an insulating material. In this case, an electric shock accident caused by power supplied from the electronic device 200 can be prevented. In some embodiments, the first body 212 and the second body 214 may be fixed to the connector 213 in a bonding or molding manner. In some embodiments, the connector 213 may be formed of a Poly Carbonate (PC) material.

According to various embodiments, when the metallic tray cover 211 is used as an antenna radiator and a side surface to which a tray mounting hole of the electronic device is placed is used as a metal bezel (or metal frame), the tray cover 212 may be insulated from or in contact with the metal bezel. In some embodiments, when the tray cover 211 is insulated from the metal bezel, it may be implemented in such a manner that an insulation member is injected to the tray cover 211.

According to various embodiments, the tray cover 211 may be utilized as a parasitic resonator which operates together with a main antenna radiator of the electronic device. According to various embodiments, the tray cover 211 may be electronically connected to a Radio Frequency (RF) end (not shown) of a Printed Circuit Board (PCB) disposed inside the electronic device, thereby providing feeding. The PCB may include any suitable type of radio circuitry, such as a Bluetooth transceiver, a WiFi transceiver, a GSM transceiver, an LTE transceiver, etc. Additionally or alternatively, the PCB may include an FM radio receiver circuit, and or any or any other suitable type of radio receiver.

According to an embodiment, in this case, when the tray 210 is completely placed to the tray mounting hole of the electronic device, the tray 210 may be electronically connected in such a manner that at least a part of the tray cover is physically in contact with a connecting member (e.g., a clip, etc.) disposed inside the electronic device. According to an embodiment, the tray cover 21 may operate through a coupling operation by being disposed near a main antenna radiator without an additional electrical connection. For example, when a metal bezel formed along with a boundary of the electronic device is utilized as the antenna radiator, the tray cover 211 may be served as an additional antenna radiator by being coupled with the metal bezel without additional electrical feeding.

According to various embodiments, the metallic tray cover 211 may be formed of a material that is attracted to a magnet included in a tray extraction element to be described below. In some implementations, the tray cover 211 may be formed of a ferromagnetic material. Additionally or alternatively, the tray cover 211 may be formed of a magnetic material.

According to various embodiments, at least one tray-fixing portion 2143 may be disposed on left and right side surfaces of the second body 214. According to an embodiment, the tray-fixing portion 2143 may be formed together when the second body 214 is formed. According to an embodiment, when the tray 210 is completely inserted into the tray mounting hole of the electronic device, the tray-fixing portion 2143 may be inserted in a forced manner to a corresponding protrusion inside a slot so that a location thereof can be maintained without autonomous movement.

According to various embodiments, a sealing member 2121 may be disposed on the first body 212 along with an outer circumference. According to an embodiment, when the tray 210 is completely inserted into the tray mounting hole of the electronic device, the sealing member 212 may perform a function of preventing water, foreign materials, or the like from being permeated through the tray mounting hole while maintaining a location thereof. According to an embodiment, when the tray 210 is completely inserted into the tray mounting hole of the electronic device, the sealing member 2121 may prevent noise which may be generated by a collision between the tray and the tray mounting hole. According to an embodiment, the sealing member 2121 may be formed of at least one material selected from rubber, urethane, and silicone.

Referring to FIG. 3, the first external component 230 may be placed to the first external component mounting portion 2141 of the second body 214 of the tray 210, and the second external component 240 may be placed to the second external component mounting portion 2142. According to an embodiment, the first external component 230 may be a memory card. According to an embodiment, the second external component 240 may be a SIM card.

Figure 4A:
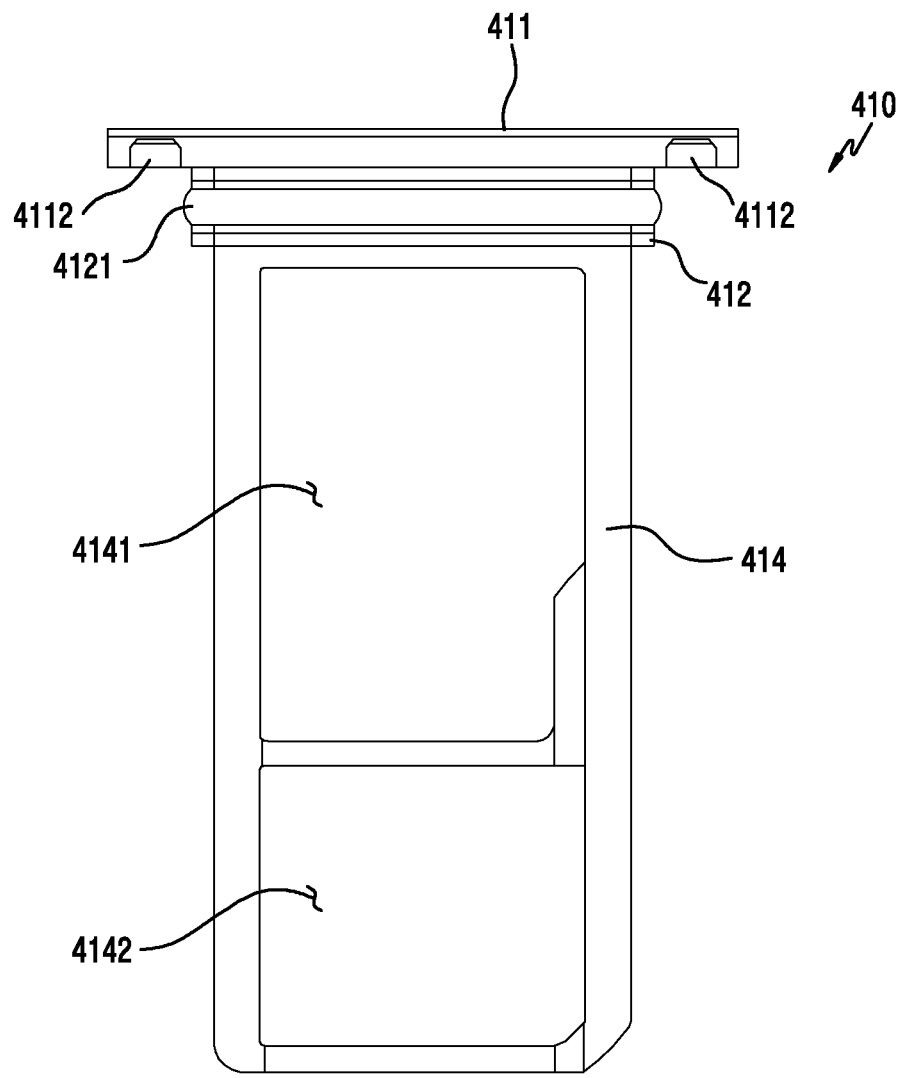
FIG. 4A is a diagram of an example of a tray, according to various embodiments of the present disclosure.
Figure 4B:
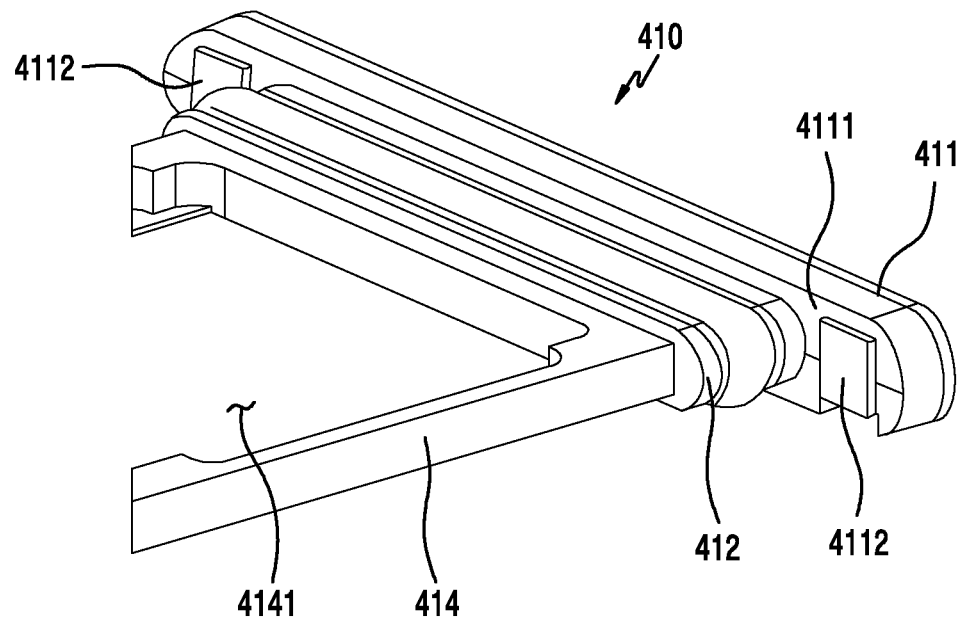
FIG. 4B is a partial perspective view of the tray of FIG. 4A, according to various embodiments of the present disclosure.

FIG. 4A and FIG. 4B are diagrams of an example of a tray 410 according to various embodiments of the present disclosure.

Referring to FIG. 4A and FIG. 4B, the tray 410 may be formed in combination of a first body 412 and a second body 414. A sealing member 4121 may wrap around an outer circumferential surface of the first body 412. According to an embodiment, one pair of external component mounting portions 4141 and 4142 may be disposed on the second body 414. It is also possible to dispose more than one pair of the external component mounting portions.

According to various embodiments, if a tray cover 411 is formed of a nonmagnetic material, the tray 410 may additionally include at least one magnet 4112. According to an embodiment, the tray 410 may include one pair of magnets 4112 disposed on both left and right sides of an inner surface 4111 of the tray cover 411. According to an embodiment, the one pair of magnets 4112 may be disposed on a groove formed on the tray cover 411 in an inserted, co-molded, or attached manner.

Figure 5A:
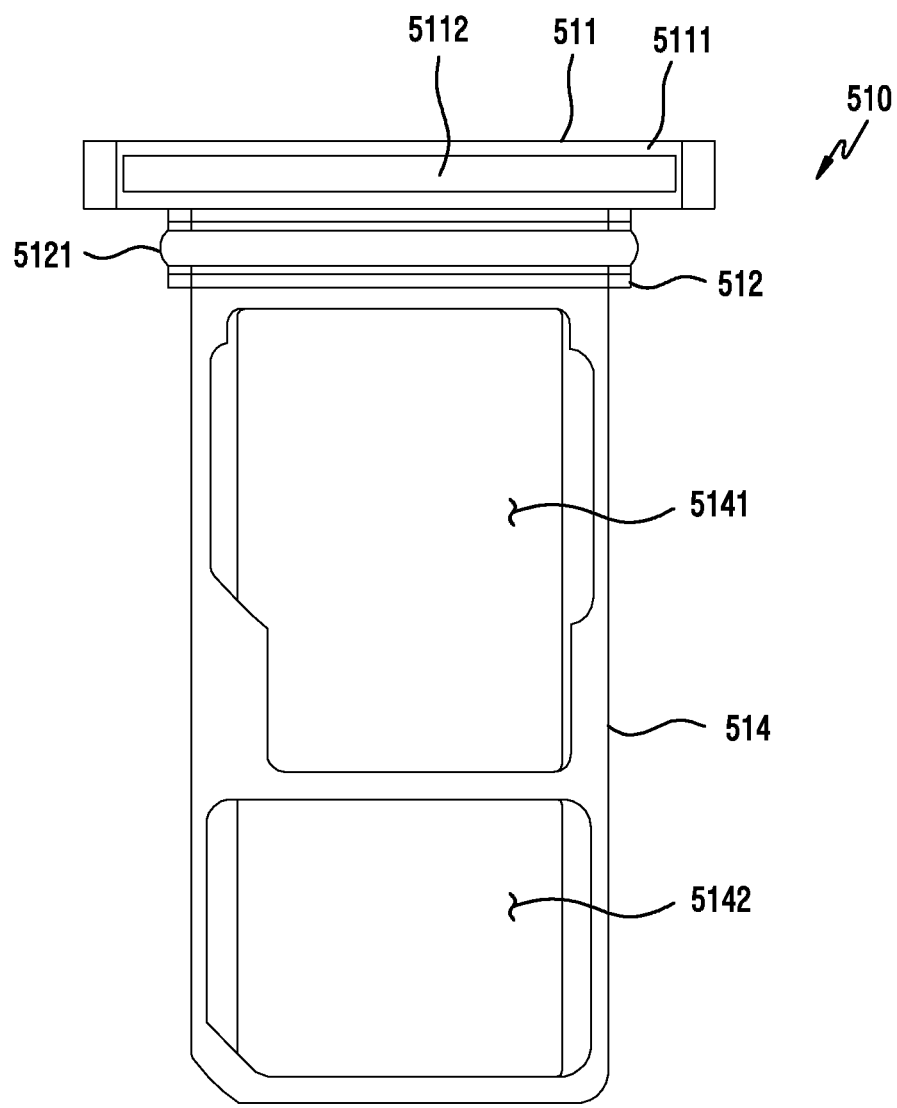
FIG. 5A is a diagram of an example of a tray, according to various embodiments of the present disclosure.
Figure 5B:
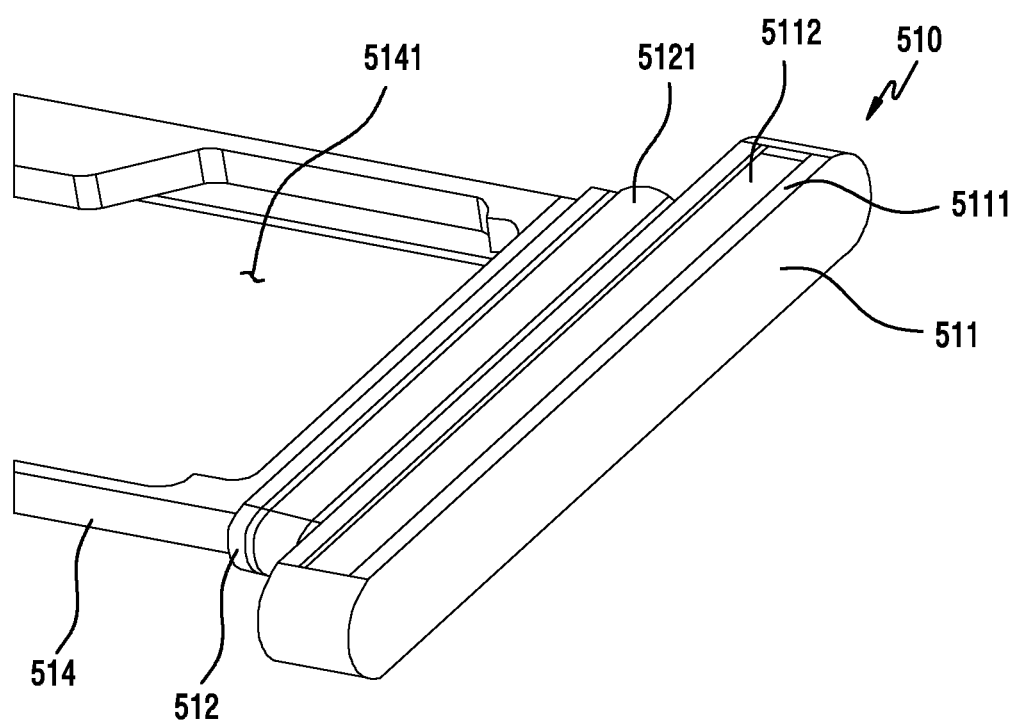
FIG. 5B is a partial perspective view of the tray of FIG. 5A, according to various embodiments of the present disclosure.

FIG. 5A and FIG. 5B are diagrams of an example of a tray 510 according to various embodiments of the present disclosure.

Referring to FIG. 5A and FIG. 5B, the tray 510 may be formed in combination of a first body 512 and a second body 514. A sealing member 5121 may wrap around an outer circumferential surface of the first body 512. According to an embodiment, one pair of external component mounting portions 5141 and 5142 may be disposed on the second body 514. It is also possible to dispose more than one pair of the external component mounting portions.

According to various embodiments, if a tray cover 511 is formed of a nonmagnetic material, the tray 510 may additionally include at least one magnet 5112. In some embodiments, the tray 510 may include one pair of magnets 5112 disposed on an upper surface 5111 along the length of the tray cover 511. According to an embodiment, a magnet may be disposed on a bottom surface along the length of the tray cover 511. According to an embodiment, the magnet 5112 may be disposed in a groove formed along the length of the upper surface and/or the bottom surface of the tray cover 511 in an inserted, co-molded, or attached manner.

Figure 6A:
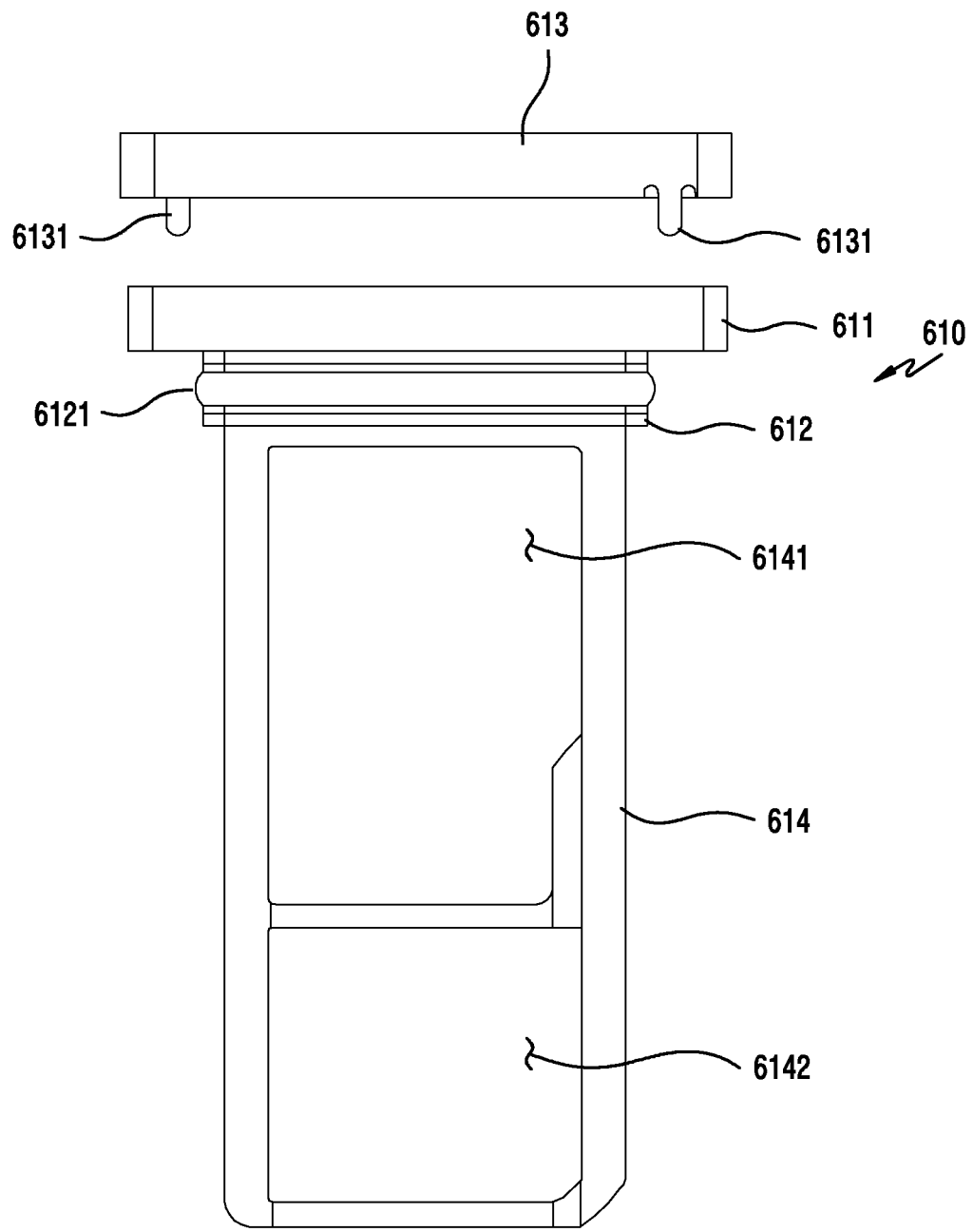
FIG. 6A is a diagram of an example of a tray and a detachable tray cap, according to various embodiments of the present disclosure.
Figure 6B:
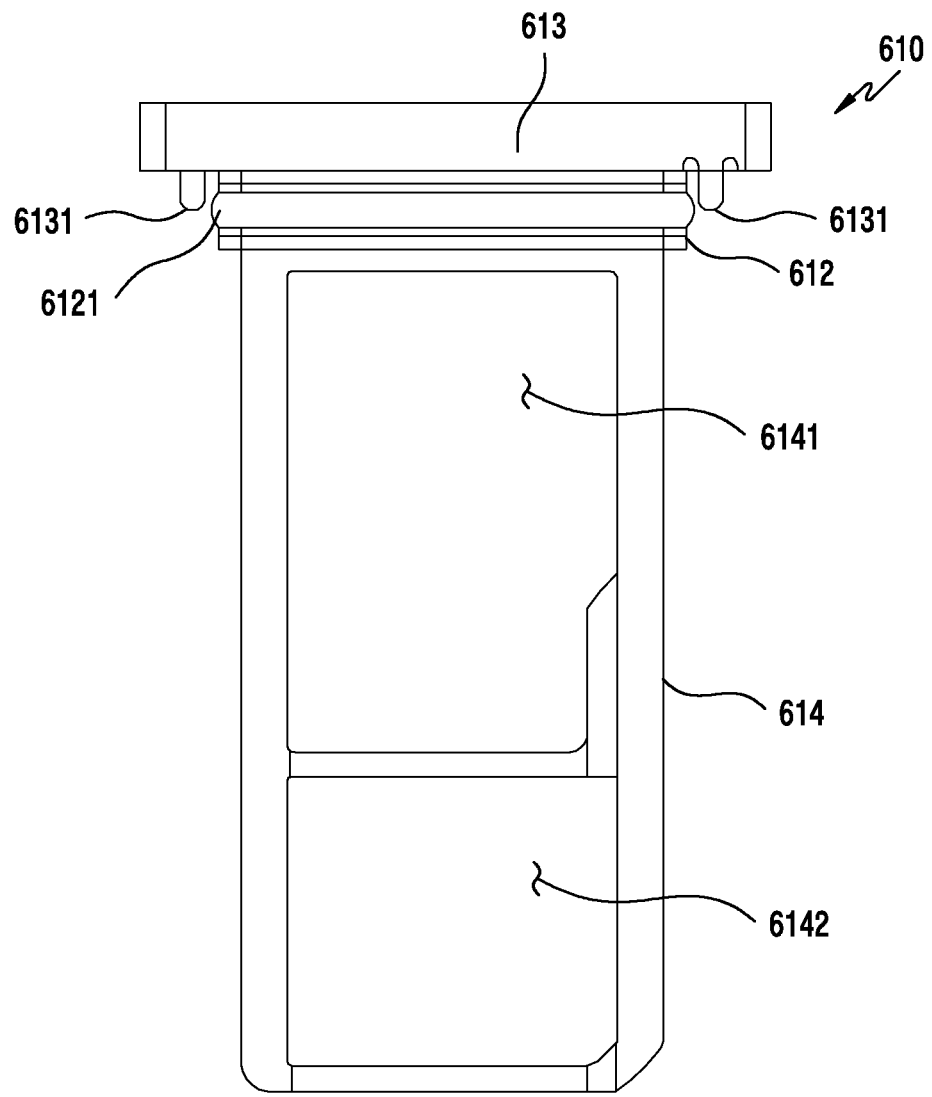
FIG. 6B is a diagram of the tray of FIG. 6A with the cap mounted thereon, according to various embodiments of the present disclosure.

FIGS. 6A and 6B are diagrams of an example of a tray having a detachable tray cap, according to various embodiments of the present disclosure.

Referring to FIG. 6A and FIG. 6B, a tray 610 may be formed in combination of a first body 612 and a second body 614. A sealing member 6121 may wrap around an outer circumferential surface of the first body 612. According to an embodiment, one pair of external component mounting portions 6141 and 6142 may be disposed on the second body 614. It is also possible to dispose more than one pair of the external component mounting portions.

According to various embodiments, if the tray cover 611 is inserted into a tray mounting hole of an electronic device, the tray cap 613 may be applied to compensate a color of a portion exposed outside the electronic device of the tray cover 611 or to apply various colors. In some embodiments, the tray cap 613 may be formed of a metal (and/or magnetic) material. However, the present disclosure is not limited thereto, and thus a non-metallic tray cap may also be applied. In some embodiments, the tray cap 613 may be disposed on wrap the entirety of the tray cover 611 of the tray 610. In some embodiments, the tray cap 613 may include a bending piece 6131 extracted downwardly with a specific length from each of both ends. In some embodiments, the bending pieces 6131 may be installed such that the tray cap 613 is disposed between the bending pieces 6131, and thereafter may be bent inwardly toward each other, so that the tray cap 613 can be fixed to the tray cover 611.

Figure 7A:
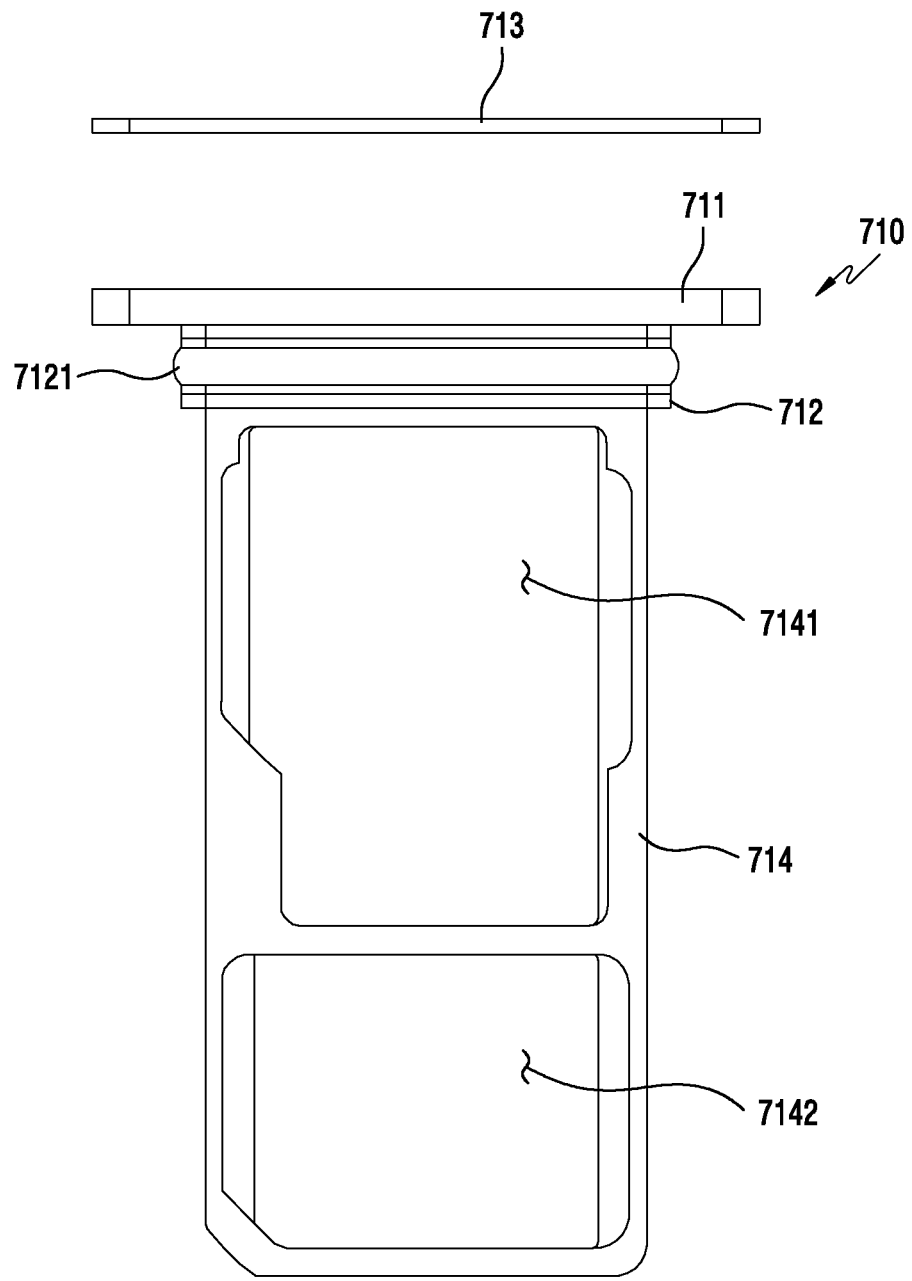
FIG. 7A is a diagram of an example of a tray and a detachable tray cap, according to various embodiments of the present disclosure.
Figure 7B:
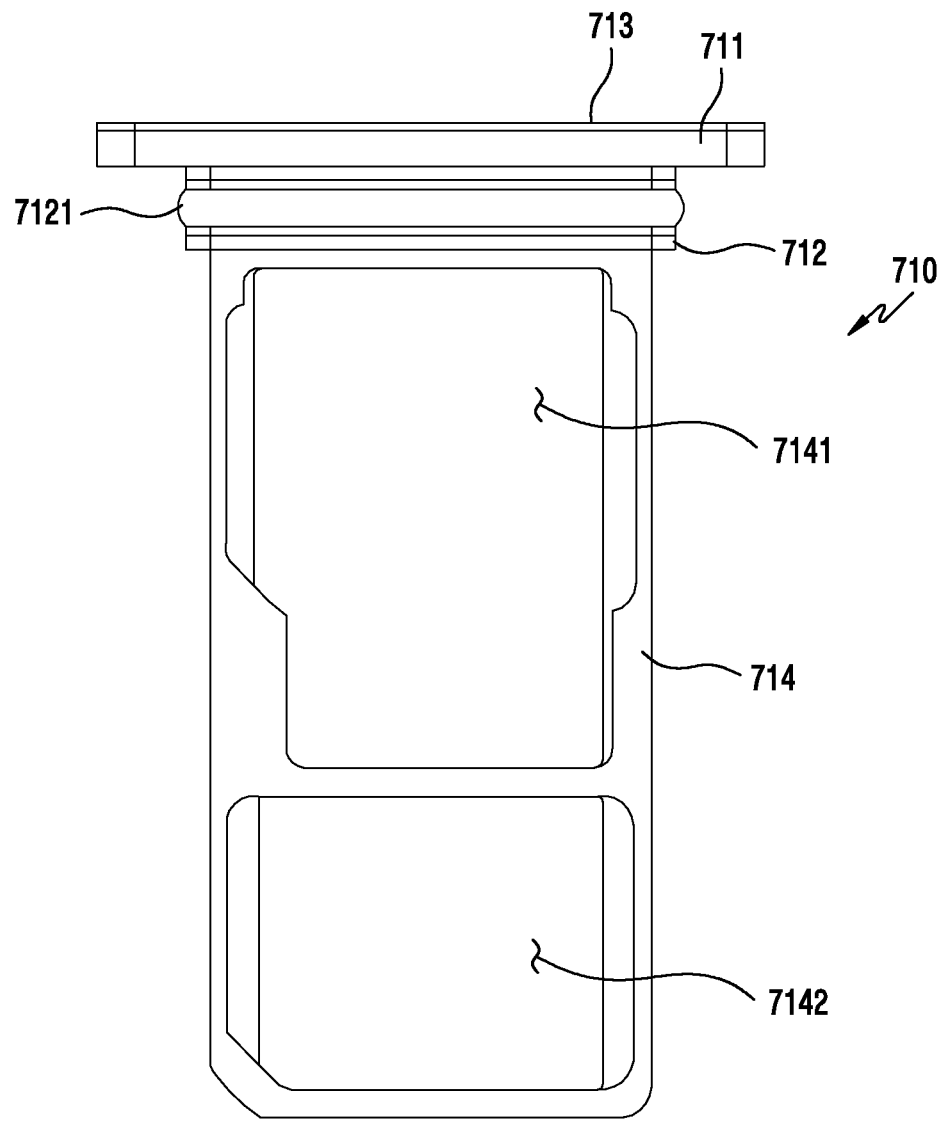
FIG. 7B is a diagram of the tray of FIG. 7A with the cap mounted thereon, according to various embodiments of the present disclosure.

FIGS. 7A and 7B are diagrams of an example of a tray having a detachable tray cap, according to various embodiments of the present disclosure.

Referring to FIG. 7A and FIG. 7B, a tray 710 may be formed in combination of a first body 712 and a second body 714. A sealing member 7121 may wrap around an outer circumferential surface of the first body 712. According to an embodiment, one pair of external component mounting portions 7141 and 7142 may be disposed on the second body 714. It is also possible to dispose more than one pair of the external component mounting portions.

According to various embodiments, if the tray cover 711 is inserted into a tray mounting hole of an electronic device, the tray cap 713 may be applied to compensate a color of a portion exposed outside the electronic device of the tray cover 711 or to apply various colors. In some embodiments, the tray cap 713 may be formed of a metal material. However, the present disclosure is not limited thereto, and thus a non-metallic tray cap may also be applied.

In some embodiments, the tray cap 713 may be applied only to a portion exposed in the electronic device having the tray cover 711 of the tray 710. In this case, the tray cap 713 may be attached to the tray cover 711 in a bonding manner.

FIG. 8A-D illustrate a technique for extracting a tray 810 from an electronic device 800 by using a tray extraction element 820 according to various embodiments of the present disclosure.

Figure 8A:
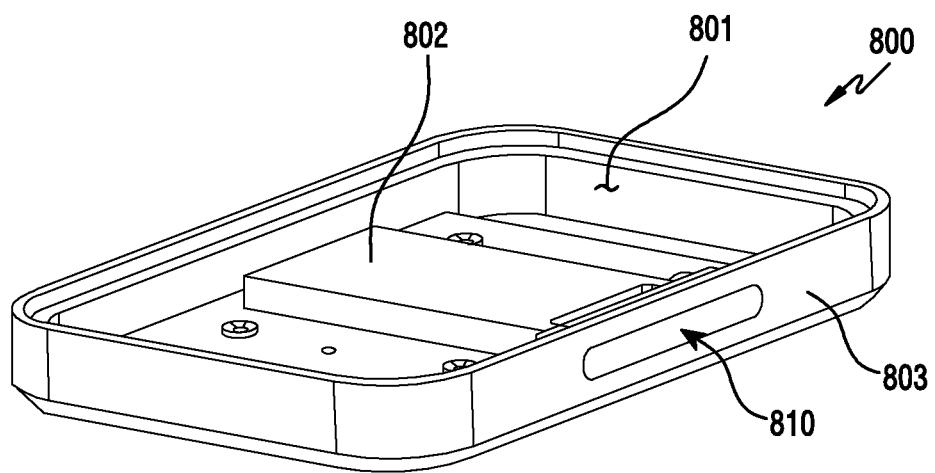
FIG. 8A is a diagram of an example of an electronic device, according to various embodiments of the present disclosure.
Figure 8B:
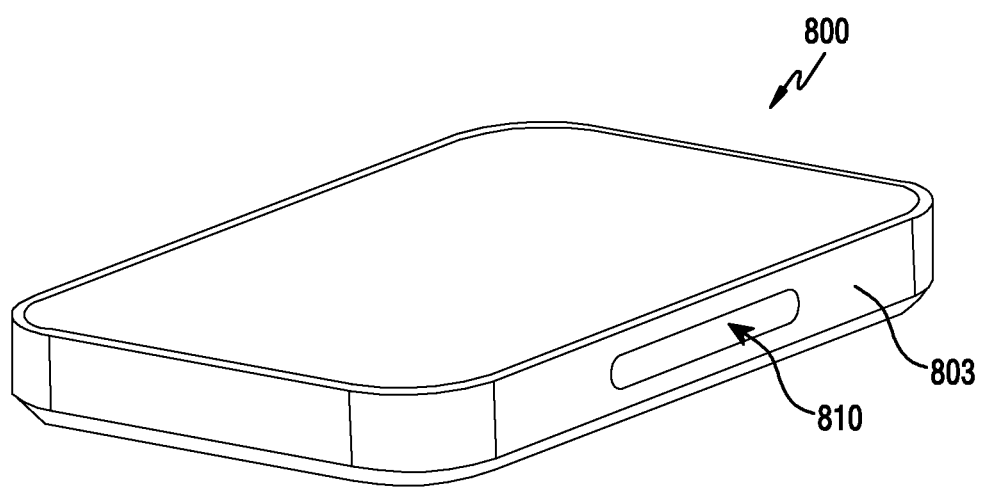
FIG. 8B is another diagram of the electronic device of FIG. 8A, according to various embodiments of the present disclosure

Referring to FIG. 8A and FIG. 8B, a slot 802 for accommodating the tray 810 may be disposed in an inner space 801 of the electronic device 800. In some embodiments, the tray 810 may be inserted into the slot 802 from an opening in a side surface 803 of the electronic device 800.

Figure 8C:
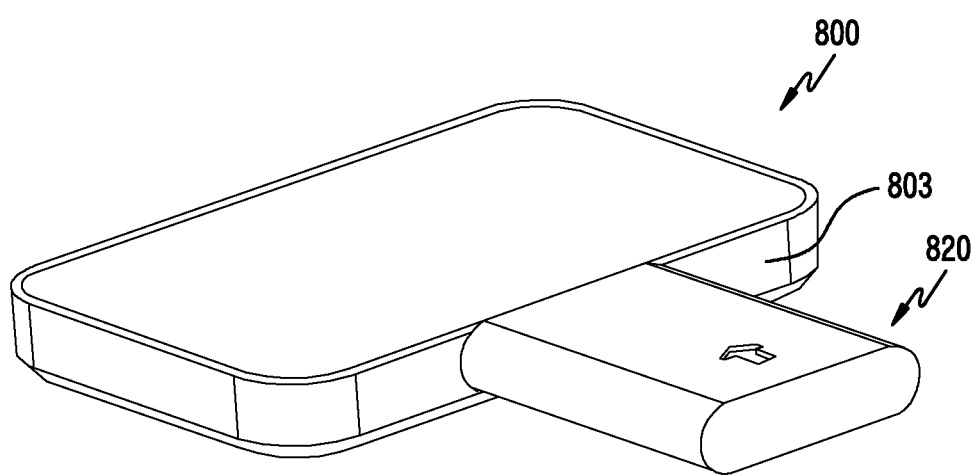
FIG. 8C is another diagram of the electronic device of FIG. 8A, according to various embodiments of the present disclosure
Figure 8D:
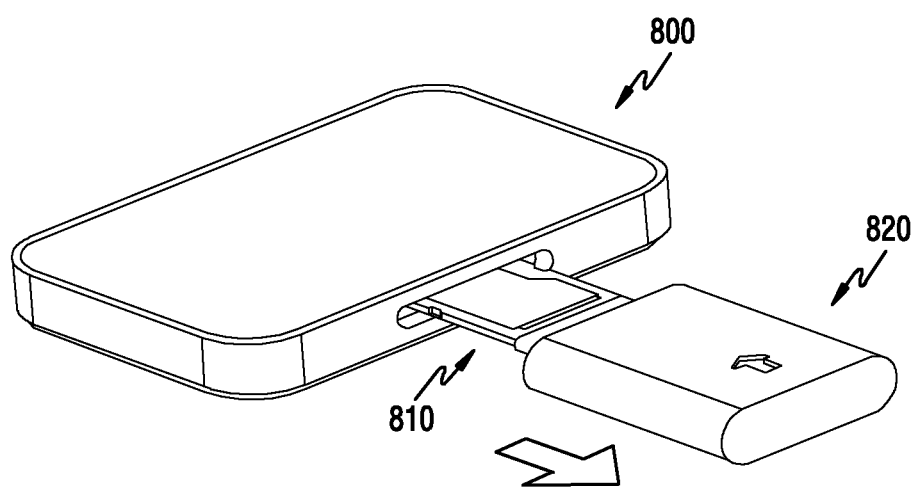
FIG. 8D is another diagram of the electronic device of FIG. 8A, according to various embodiments of the present disclosure

Referring to FIG. 8C, when the tray 810 is separated from the electronic device 800, the tray extraction element 820 may come in physical and/or magnetic contact with the side surface 803 of the electronic device 800, for example, near a location at which the tray 810 is inserted. In this example, since the tray 810 includes a tray cover including a member that is attracted to a magnet included in the tray extraction element 820 (e.g., a magnet, a ferromagnetic member, etc.), the tray 810 may be extracted by being guided toward an outer side of the electronic device 800 as shown in FIG. 8D by the use of the tray extraction element 820.

Figure 9A:
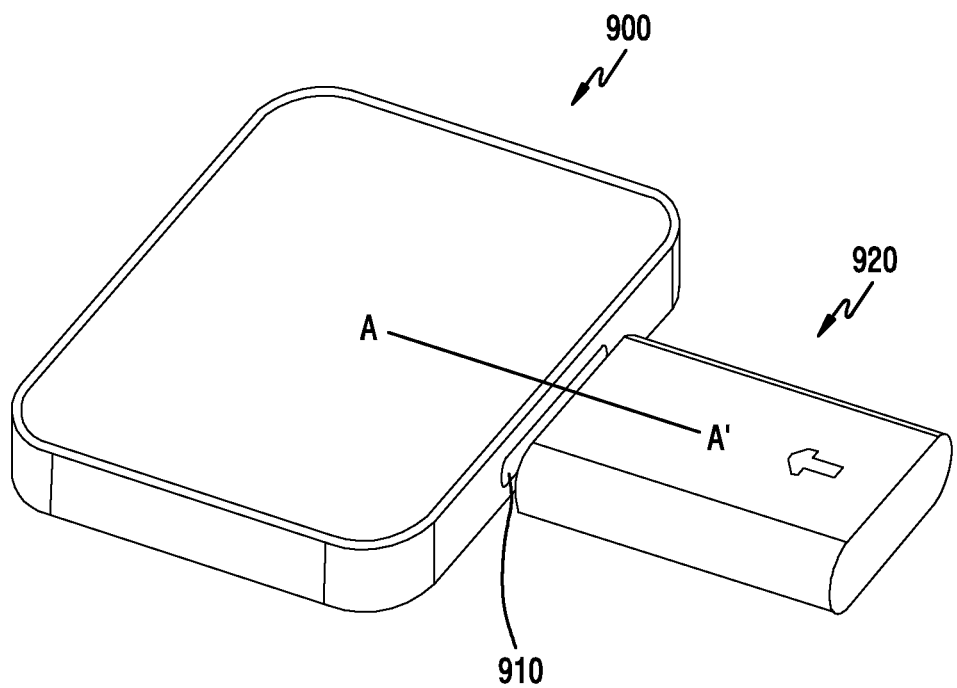
FIG. 9A is a diagram of an example of an electronic device, according to various embodiments of the present disclosure.
Figure 9B:
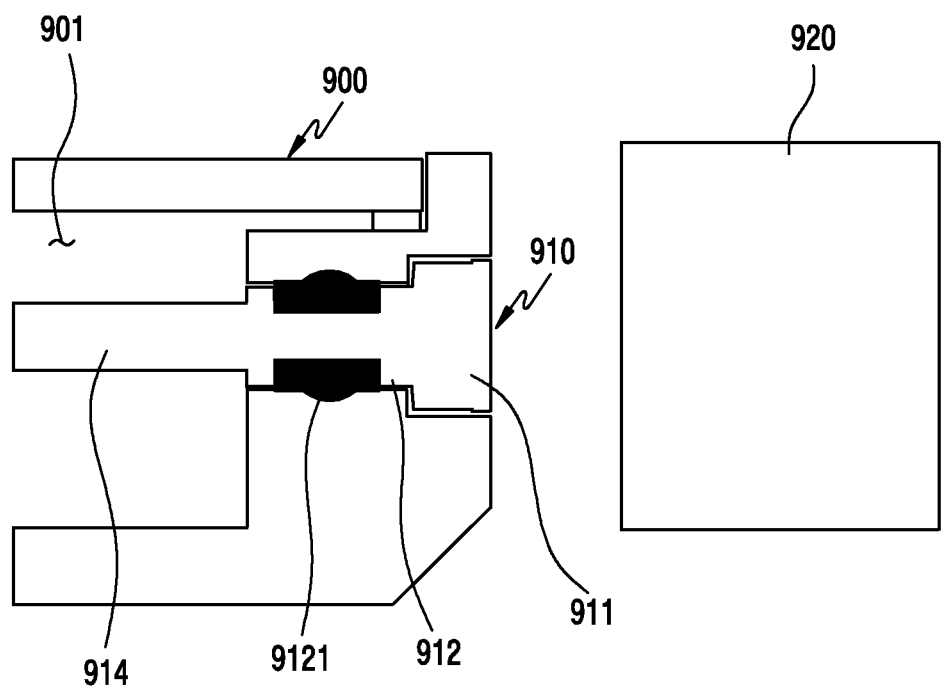
FIG. 9B is a cross-sectional view of the electronic device of FIG. 9A, according to various embodiments of the present disclosure.

FIG. 9A is a perspective view illustrating an example in which a tray 910 is inserted in an electronic device 900 according to various embodiments of the present disclosure. FIG. 9B is a cross-sectional view of the electronic device taken along the line A-A', according to various embodiments of the present disclosure.

Referring to FIG. 9A and FIG. 9B, when the tray 910 in the electronic device 900 is completely inserted into an inner space 901 of the electronic device 900, a sealing member 9121 may be disposed on a first body 912 formed in combination with a tray cover 911 of the tray 910. According to an embodiment, an external component (not shown) may be placed to a second body 914.

According to various embodiments, when the tray 910 is completely inserted into the electronic device 900, the sealing member 9121 may wrap around an outer circumferential surface of the first body 912 may be tightly attached to an internal frame of the electronic device 900. In some embodiments, the sealing member 9121 can prevent water and foreign materials permeated through the tray 910, and can avoid noise generation caused by a collision between the tray 910 and the electronic device 900. A reference numeral 920 may indicate a tray extraction element.

Figure 10A:
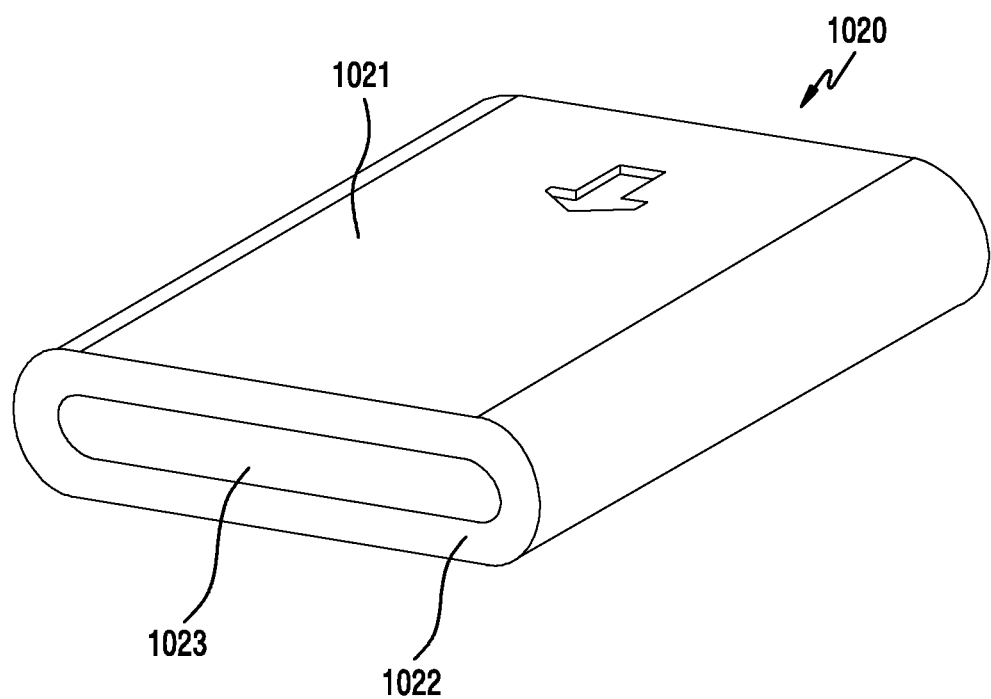
FIG. 10A is a diagram of an example of a tray extraction element, according to various embodiments of the present disclosure.
Figure 10B:
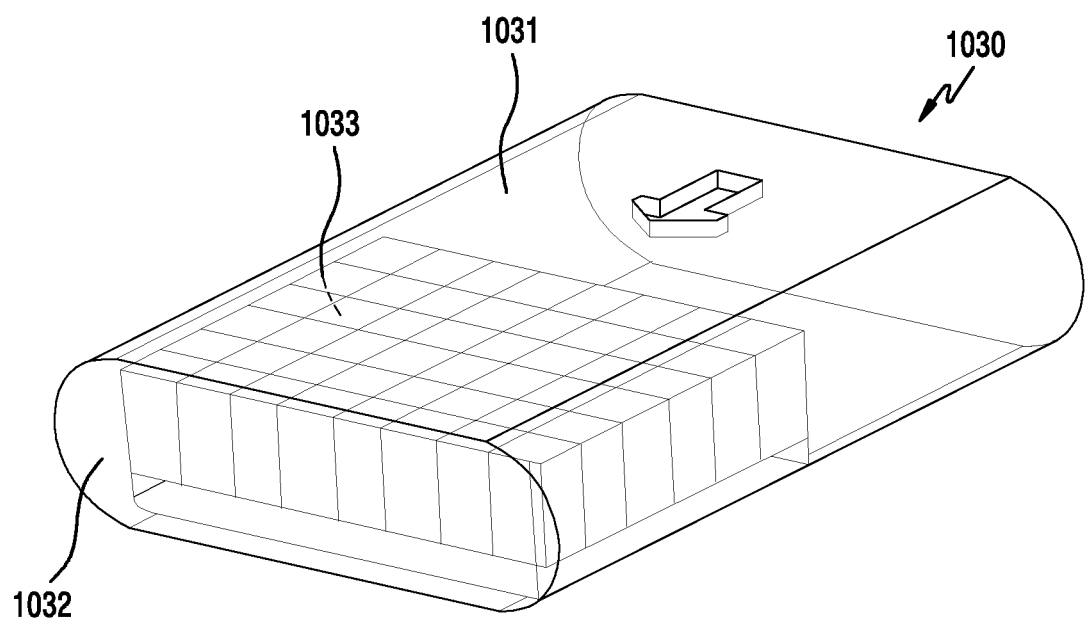
FIG. 10B is a diagram of an example of a tray extraction element, according to various embodiments of the present disclosure.
Figure 10C:
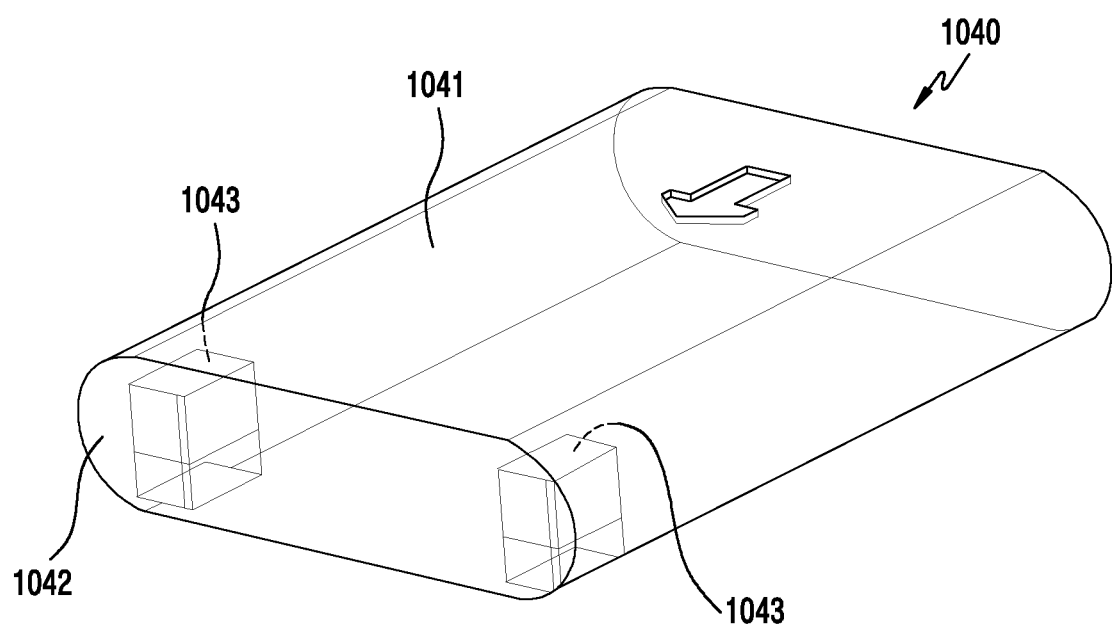
FIG. 10C is a diagram of an example of a tray extraction element, according to various embodiments of the present disclosure.

FIG. 10A to FIG. 10C are perspective views of examples of tray extraction elements 1020, 1030, and 1040 according to various embodiments of the present disclosure.

Referring to FIG. 10A, the tray extraction element 1020 may include a body 1021 having a specific shape and a tray contact area 1022 having a flat surface formed on one side of the body 1021. According to an embodiment, a magnet 1023 may be disposed near the tray contact area 1022. According to an embodiment, the magnet 1023 disposed on the body 1021 may be arranged in such a manner that a part thereof is exposed in the tray contact area 1022. According to an embodiment, in such a case, if the exposed portion of the magnet 1023 and a metallic tray cover are attracted towards one another as a result of a magnetic field, there is a high possibility that noise is generated and a damage occurs. Therefore, an additional buffer sheet may be further attached to cover the exposed magnet 1023.

Referring to FIG. 10B, a magnet 1033 may be inserted into a body 1031. In this case, the magnet 1033 may be disposed near a tray contact area 1032.

As shown in FIG. 10C, a pair of magnets 1043 may be disposed on opposite sides of the tray extraction element 1040. In this example, the magnet 1043 may be disposed near a tray contact area 1042.

According to various embodiments, a tray extraction element may be served only as a tray extraction element for separating a tray. However, the present disclosure is not limited thereto, and thus a magnet integrated into an accessory that can be carried in general by a user of an electronic device may also be used as the tray extraction element. In some embodiments, such an accessory may be a keychain or the like.

Figure 11A:
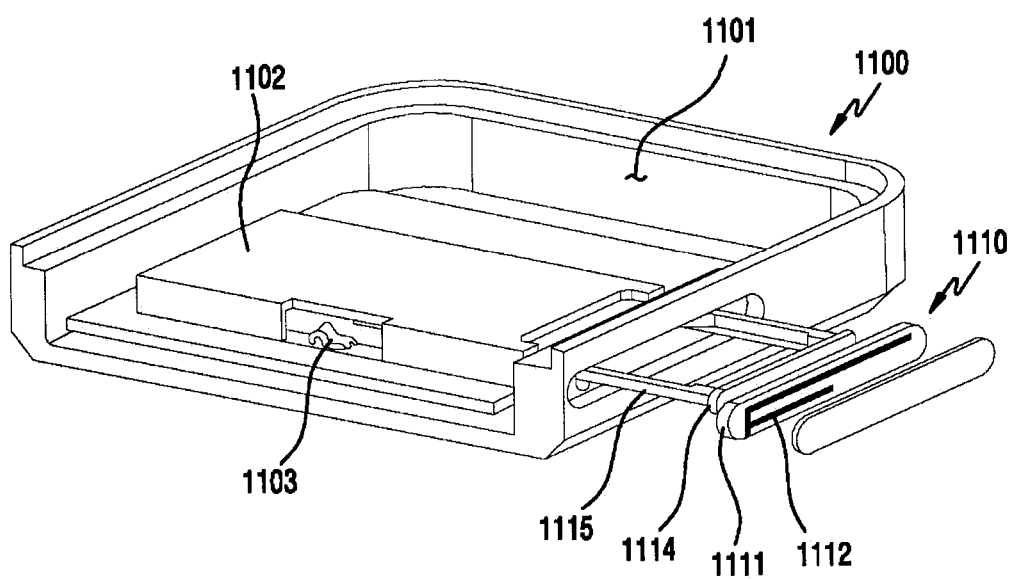
FIG. 11A is a diagram of an example of an electronic device and a tray having an embedded antenna radiator, according to various embodiments of the present disclosure.
Figure 11B:
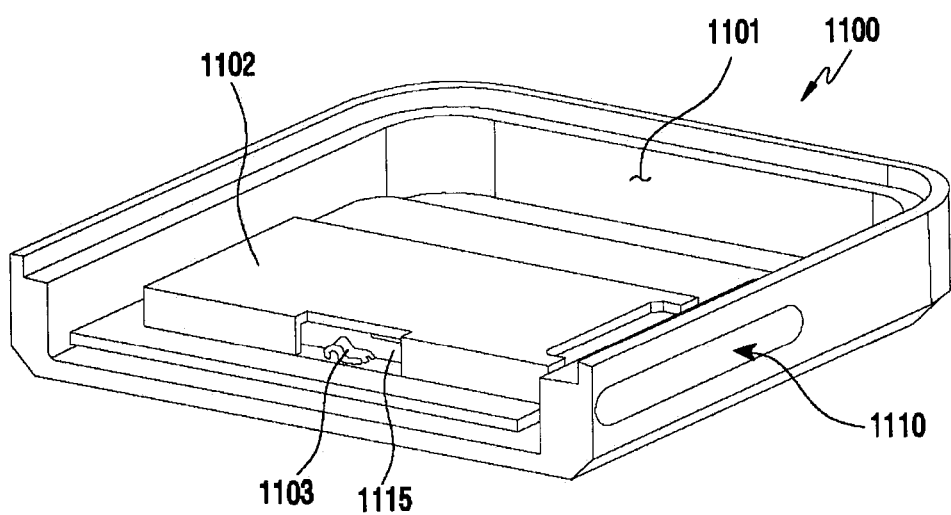
FIG. 11B is a diagram of the electronic device and a tray of FIG. 11A with the tray being fully inserted into the electronic device, according to various embodiments of the present disclosure.

FIG. 11A and FIG. 11B illustrate an example in which a tray 1110 including a radiation pattern 1112 (e.g., an antenna radiator) is electrically connected to an electronic device 1100 according to various embodiments of the present disclosure.

It is described above that a metallic tray cover 1111 of the tray 1110 can be utilized as a radiator. In the present description, it will be disclosed that an additional radiation pattern 1112 may be added as the antenna radiator to the tray cover 1111.

Referring to FIG. 11A and FIG. 11B, the electronic device 1100 may accommodate the tray 1110 into a slot 1102 disposed in an inner space 1101. In some embodiments, the tray 1110 may include the tray cover 1111 and a first body 1114 and a second body 1115 which are formed in combination with the tray cover 1111. In some embodiments, the radiation pattern 1112 having a specific shape may be formed on an outer surface of the tray cover 1111 and thus may be utilized as the antenna radiator. In some embodiments, if the tray cover 1111 and the first and second bodies 1114 and 1115 are formed of a metal material, at least a part of the second body 1115 may be physically in contact therewith naturally by means of a contact piece 1103 (e.g., contact terminal) disposed inside the slot 1102 and electrically coupled to a particular radio circuit. Accordingly, in some implementations, when the tray 1110 is placed to the electronic device 1100, a contact piece provided in the tray (e.g., a contact terminal) mates with the contact piece 1103, such that the radiation pattern 1112 (e.g., an antenna radiator) becomes electrically coupled to a particular radio circuit, such as a Bluetooth transceiver, a WiFi transceiver, a GSM transceiver, an LTE transceiver, an FM radio receiver, etc., that is part of the electronic device. The contact piece 1103 may have any suitable shape and form. For example, the contact piece 1103 may include a C-clip, a conductive poron tape, a connector, a conductive elastic means, and the like.

Figure 11C:
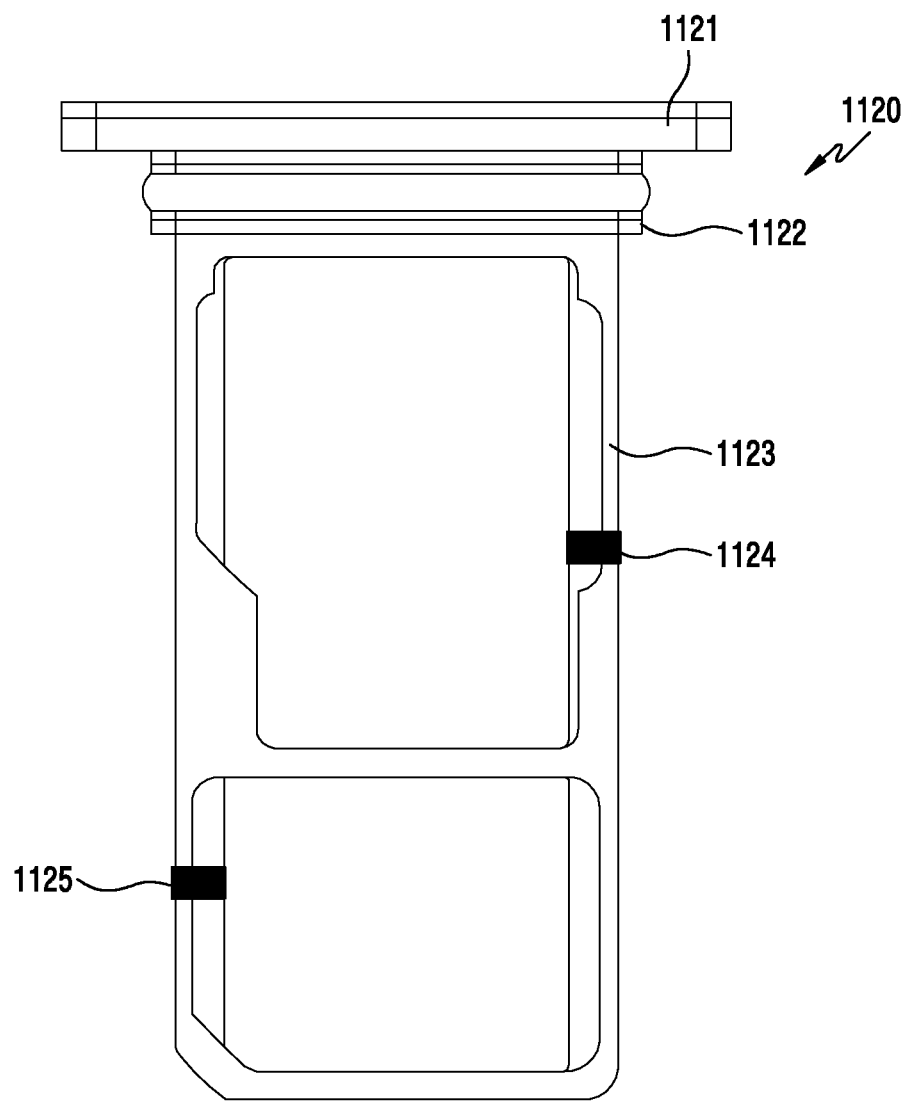
FIG. 11C is a diagram of an example of a tray having an embedded antenna radiator, according to various embodiments of the present disclosure

FIG. 11C illustrates a structure in which a part of a tray 1120 is utilized as an antenna radiator according to various embodiments of the present disclosure.

Referring FIG. 11C, the tray 1120 may include a tray cover 1121 and a first body 1122 and a second body 1123 which are formed in combination with the tray cover 1121. In this case, the second body 1123 may be formed of a metal material, and may be utilized as an antenna radiator due to one or more segment portions 1124 and 1125. In some embodiments, the segment portions 1124 and 1125 may be formed of a non-metal material (e.g., dielectric material), and thus due to each of the segment portions 1124 and 1125, the second body 1123 may be utilized as a plurality of antenna radiators having at least one different operating frequency bands.

Figure 12:
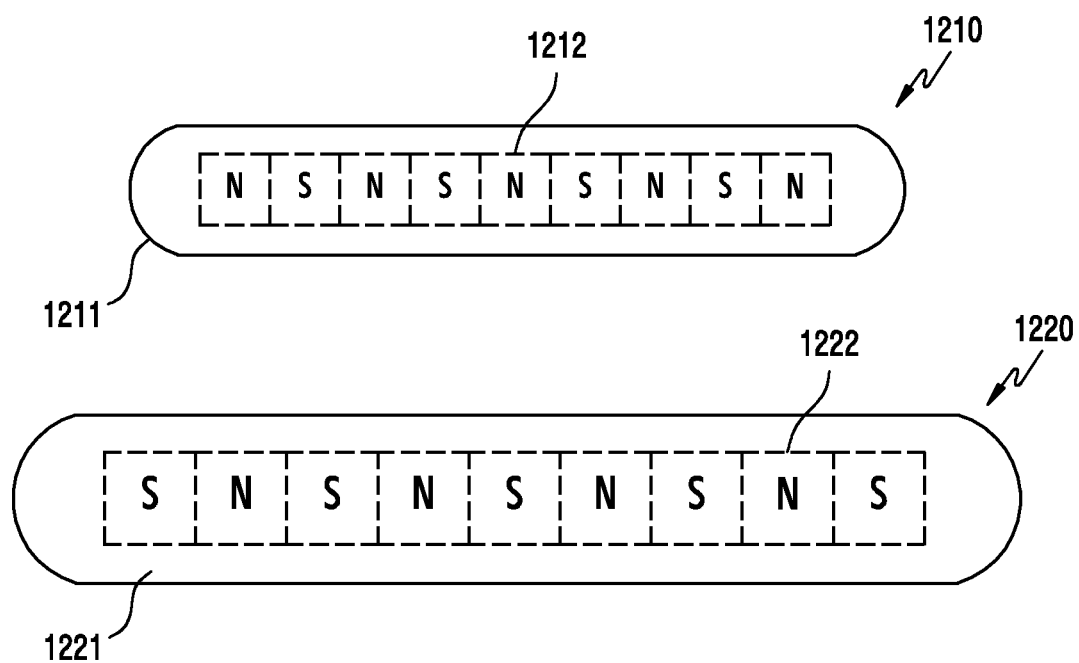
FIG. 12 is a diagram of an example of a tray extraction element, according to various embodiments of the present disclosure.

FIG. 12 is a diagram of an example of a tray extraction element, according to various embodiments of the present disclosure. FIG. 12 illustrates coded magnets 1212 and 1222 applied to a tray 1210 and a tray extraction element 1220 according to various embodiments of the present disclosure.

Referring to FIG. 12, the magnet (hereinafter, first magnet) 1212 applied to the tray 1210 and the magnet (hereinafter, second magnet) 1222 included in the tray extraction element 1220 may be coded magnets. In some embodiments, if the first magnet 1212 applied to a tray cover 1211 of the tray 1210 is disposed such that an N pole and an S pole are sequentially arranged in an alternate manner, the second magnet 1222 disposed in a contact area 1221 of the tray extraction element 1220 may be disposed such that an S pole and an N pole are sequentially arranged in an alternate manner. Therefore, when the contact area 1221 of the tray extraction element 1220 is approached to the tray cover 1211, it is guided such that different poles of the first magnet 1212 and the second magnet 1222 face each other, so that an extraction operation of the tray can be effectively performed as a result of magnetic attraction.

Figure 13A:
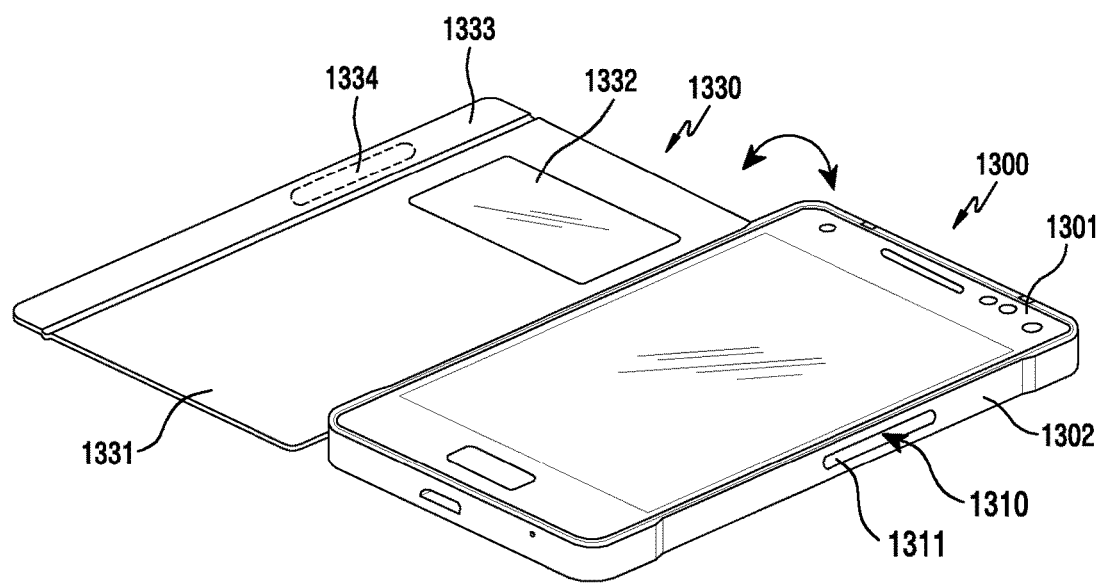
FIG. 13A is a diagram of an example of an electronic device, according to various embodiments of the present disclosure.
Figure 13B:
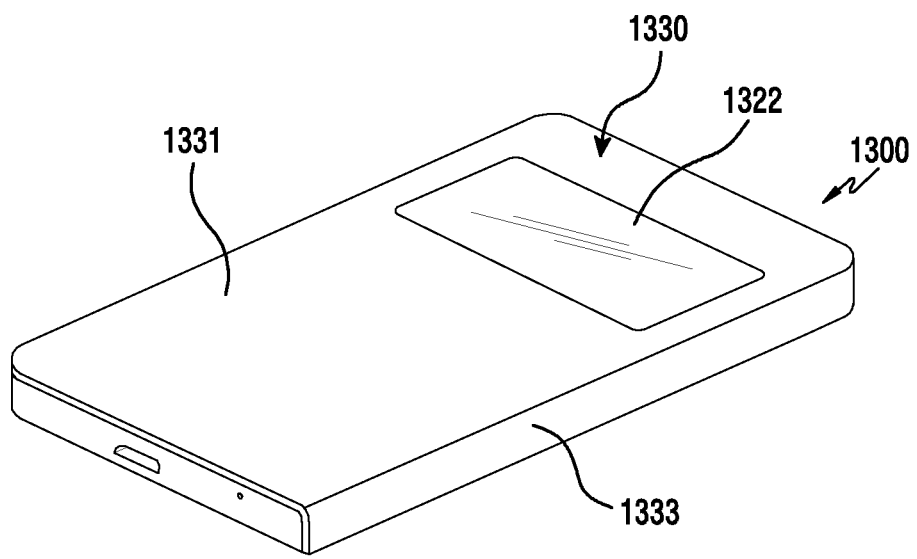
FIG. 13B is a diagram of the electronic device of FIG. 13A with the cover closed, according to various embodiments of the present disclosure

FIG. 13A and FIG. 13B are perspective views illustrating an example in which a protection cover 1330 is attached to an electronic device 1300 including a tray 1310 according to various embodiments of the present disclosure.

Referring to FIG. 13a and FIG. 13b, a tray cover 1311 of the tray 1310 exposed outside the electronic device 1300 has a magnetic member. In some embodiments, the electronic device 1300 may include the protection cover 1330 for protecting at least a part of the electronic device 1300. Although not shown, a part of the protection cover 1330 may be served as a battery cover of the electronic device 1300. In some embodiments, the protection cover 1330 may include a front cover 1331 for covering a front surface 1301 of the electronic device 1300 and a side cover 1333 extended from the front cover 1331 in a bendable manner to protect a side surface of the electronic device 1300. In some embodiments, a window 1332 may be disposed on the front cover 1331 so that a part of the electronic device 1300 can be viewed when the front cover 1331 is closed.

According to various embodiments, when the side cover 1333 is disposed at a location for protecting the side surface 1302 of the electronic device 1300, a tray contact member 1334 may be disposed at a location corresponding to the tray cover 1311 of the tray 1310 of the electronic device 1300. In some embodiments, the tray contact member 1334 may include a member made of a material that is attracted to the magnetic member included in the tray cover 1311.

According to various embodiments, when the protection cover 1330 is disposed at a location for protecting the electronic device 1300, the front cover 1331 may be disposed at a location for covering the front surface 1301 of the electronic device 1300, and the side cover 1333 may be disposed at a location for covering the side surface 1302 of the electronic device 1300. In this case, since the tray contact member 1334 disposed on the side cover 1333 may be attached to the tray cover 1311 including the magnetic member, the side cover 1333 may be controlled not to randomly move after the side cover 1333 is brought in contact with the side surface 1302 of the electronic device 1300.

According to various embodiments, if the magnetic member (e.g., magnet) can be provided to the tray, an additional tray extraction element may not be used. For example, the tray can be separated from the electronic device in such a manner that the tray cover portion of the electronic device is brought in contact with a metal construction to be affected by magnetism and used in everyday life (e.g., a metal construction having a flat surface).

According to various embodiments, an additional physical structure for separating a tray from an electronic device is not applied to an outer surface of the electronic device. Therefore, the tray can facilitate a good design plan of the electronic device, can be easily separated from the electronic device, and can add another function to use at least two functions, thereby being able to improve the function of the electronic device.

While various embodiments of the present disclosure have been shown and described with reference to certain preferred embodiments thereof, it will be understood by those skilled in the art that various changes in form and details may be made therein without departing from the spirit and scope of the embodiments of the present disclosure as defined by the appended claims. Therefore, the scope of the various embodiments of the present disclosure is defined not by the detailed description of the various embodiments of the present disclosure but by the appended claims, and all differences within the scope will be construed as being included in the various embodiments of the present disclosure.

FIGS. 1-13B are provided as an example only. At least some of the steps discussed with respect to these figures can be performed concurrently, performed in a different order, and/or altogether omitted. It will be understood that the provision of the examples described herein, as well as clauses phrased as "such as," "e.g.", "including", "in some aspects," "in some implementations," and the like should not be interpreted as limiting the claimed subject matter to the specific examples. No claim element herein is to be construed under the provisions of 35 U.S.C. 112, sixth paragraph, unless the element is expressly recited using the phrase "means for".

The above-described aspects of the present disclosure can be implemented in While the present disclosure has been particularly shown and described with reference to the examples provided therein, it will be understood by those skilled in the art that various changes in form and details may be made therein without departing from the spirit and scope of the present disclosure as defined by the appended claims.

What is claimed is:

1. An electronic device comprising:
    a housing;
    a tray detachably disposed in a slot formed in the housing, wherein the tray includes:
       a mounting portion adapted to receive a removable external component,
       a tray cover having a surface facing an exterior of the housing and is formed of a metal material or a magnetic material, and
       a connector formed between the mounting portion and the tray cover; and
    a tray extraction element detachable from the housing and including at least one magnet that is adapted to extract the tray from the slot via a magnetic force that is exerted on the tray by the at least one magnet, when the tray extraction element is placed on an exterior of the electronic device.

2. The electronic device of claim 1, wherein the tray includes at least one magnet.

3. The electronic device of claim 2, wherein the at least one magnet is included in the tray cover.

4. The electronic device of claim 1, further comprising a tray cap disposed on the surface of the tray cover.

5. The electronic device of claim 4, wherein the tray cap is formed of a metal material or a non-metal material.

6. The electronic device of claim 1, wherein at least one of the mounting portion and the connector is formed of a metal material.

7. The electronic device of claim 1, further comprising a radio circuit, wherein the tray cover is: (i) coupled to the radio circuit, and (ii) adapted to operate as an antenna radiator of the radio circuit.

8. The electronic device of claim 1, further comprising a radio circuit coupled to an antenna radiator, wherein the tray cover is adapted to operate as a parasitic resonator of the antenna radiator.

9. The electronic device of claim 1, wherein when the mounting portion is formed of a metal material and the connector is formed of a dielectric material adapted to electrically insulate the housing from the mounting portion.

10. The electronic device of claim 1, wherein the tray further includes at least one antenna radiator disposed in at least one of the mounting portion, the tray cover, and the connector.

11. The electronic device of claim 10, wherein the antenna radiator is electrically coupled to the electronic device when the tray is inserted into the slot of the housing.

12. The electronic device of claim 1, further comprising a radio circuit coupled to a first contact terminal disposed within the housing, and wherein the tray further includes an antenna radiator coupled to a second contact terminal, the second contact terminal being adapted to electrically couple to the first contact terminal when the tray is inserted into the slot.

13. The electronic device of claim 1, wherein the external component includes removable integrated circuit module, wherein the removable integrated circuit module includes at least one of a Subscriber Identification Module (SIM) card and a memory card.

14. The electronic device of claim 1, wherein the tray further includes a sealing member adapted to at least partially prevent at least one of moisture or dust from entering the housing.

15. An electronic device comprising:
    a tray,
    a tray extraction element detachable from the electronic device for extracting the tray from an electronic device, the tray extraction element comprising:
    a body; and
    a tray contact portion that is at least partially formed of a metal material or a magnetic material,
    wherein the tray contact portion is adapted to extract the tray from the electronic device by magnetically coupling with the tray when the tray contact portion is placed on an exterior of the electronic device and brought into magnetic contact with a cover of the tray, the cover of the tray is at least partially formed of a metal material or a magnetic material.

16. The tray extraction element of claim 15, wherein the tray is formed of the magnetic material.

17. A tray of an electronic device comprising:
    a mounting portion adapted to receive a removable integrated circuit module;
    a tray cover that is at least partially formed of a metal material or a magnetic material; and
    a connector formed between the mounting portion and the tray cover, wherein the tray cover is adapted to magnetically couple to a tray extraction element detachable from a housing of the electronic device and including at least one magnet, so that the tray extraction element is capable of extracting the tray from a slot in the housing of an electronic device when the tray extraction element is placed on an exterior of the electronic device.

18. A kit comprising:

an electronic device including a housing having a slot;

a tray extraction element detachable from the housing; and a tray disposed in the slot, wherein the tray includes a mounting portion adapted to receive a removable integrated circuit module, a tray cover having a surface facing an exterior of the housing and is at least partially formed of a metal material or a magnetic material, and a connector formed between the mounting portion and the tray cover, and wherein the tray extraction element includes a body and a tray contact portion that is at least partially formed of a metal material or a magnetic material, the tray contact portion being adapted to extract the tray from the electronic device by magnetically coupling with the tray when the tray contact portion is placed on an exterior of the electronic device and brought into magnetic contact with the tray cover.

19. An electronic device comprising:

a housing;

a tray detachably disposed in a slot formed in the housing, wherein the tray includes:
- a mounting portion adapted to receive a removable external component,
- a tray cover having a surface facing an exterior of the housing and is formed of a metal material or a magnetic material, and
- a connector formed between the mounting portion and the tray cover, wherein the mounting portion includes two or more dielectric segment portions that divide the mounting portion into two or more segments, each segment operable as an antenna radiator for the electronic device at a specified frequency band; and a tray extraction element detachable from the housing and including at least one magnet that is adapted to extract the tray from the slot via a magnetic force that is exerted on the tray by the at least one magnet, when the tray extraction element is placed on an exterior of the electronic device.

\* \* \* \* \*